US007005375B2

(12) United States Patent
Karthikeyan et al.

(10) Patent No.: US 7,005,375 B2
(45) Date of Patent: Feb. 28, 2006

(54) METHOD TO AVOID COPPER CONTAMINATION OF A VIA OR DUAL DAMASCENE STRUCTURE

(75) Inventors: Subramanian Karthikeyan, Orlando, FL (US); Sailesh M. Merchant, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 111 days.

(21) Appl. No.: 10/260,727

(22) Filed: Sep. 30, 2002

(65) Prior Publication Data

US 2004/0063307 A1 Apr. 1, 2004

(51) Int. Cl.
*H01L 21/4763* (2006.01)

(52) U.S. Cl. ....................... 438/638; 438/639; 438/672; 438/675; 438/696; 438/720; 438/722; 438/742

(58) Field of Classification Search ................. 438/638, 438/639, 672, 675, 696, 720, 722, 754, 742
See application file for complete search history.

(56) References Cited

U.S. PATENT DOCUMENTS

| | | | | | |
|---|---|---|---|---|---|
| 5,821,168 | A | * | 10/1998 | Jain | 438/692 |
| 5,985,762 | A | | 11/1999 | Geffken et al. | |
| 6,114,243 | A | | 9/2000 | Gupta et al. | |
| 6,177,347 | B1 | * | 1/2001 | Liu et al. | 438/675 |
| 6,251,789 | B1 | * | 6/2001 | Wilson et al. | 438/693 |
| 6,265,313 | B1 | * | 7/2001 | Huang et al. | 438/687 |
| 6,287,977 | B1 | * | 9/2001 | Hashim et al. | 438/722 |
| 6,498,091 | B1 | * | 12/2002 | Chen et al. | 438/627 |
| 6,521,533 | B1 | * | 2/2003 | Morand et al. | 438/687 |
| 6,576,982 | B1 | | 6/2003 | You et al. | |
| 6,607,977 | B1 | * | 8/2003 | Rozbicki et al. | 438/627 |
| 2001/0049181 | A1 | * | 12/2001 | Rathi et al. | 438/471 |
| 2002/0001952 | A1 | * | 1/2002 | Chooi et al. | 438/687 |
| 2002/0068458 | A1 | * | 6/2002 | Chiang et al. | 438/694 |
| 2002/0117399 | A1 | * | 8/2002 | Chen et al. | 205/125 |
| 2002/0142622 | A1 | * | 10/2002 | Iljima et al. | 438/768 |
| 2002/0162736 | A1 | * | 11/2002 | Ngo et al. | 204/192.12 |
| 2003/0116427 | A1 | * | 6/2003 | Ding et al. | 204/192.17 |

FOREIGN PATENT DOCUMENTS

| | | | |
|---|---|---|---|
| EP | 1 233 448 | A3 | 8/2002 |
| EP | 1 233 448 | A2 | 8/2002 |
| WO | WO 98/52219 | A1 | 11/1998 |
| WO | WO 02/39500 | A2 | 5/2002 |
| WO | WO 03/048407 | A1 | 6/2003 |

* cited by examiner

*Primary Examiner*—Mary Wilczewski
*Assistant Examiner*—Toniae M. Thomas

(57) ABSTRACT

A process for preventing interconnect metal diffusion into the surrounding dielectric material. Prior to the formation of a metal interconnect in an opening of a dielectric region, the underlying metal surface is cleaned, during which metal can be deposited on the sidewalls of the opening. This metal can diffuse into the dielectric and cause leakage currents. To prevent deposition of the metal onto the sidewalls a barrier layer is deposited into the opening and sputtered onto the sidewalls before the metal surface cleaning step.

39 Claims, 12 Drawing Sheets

METHOD TO AVOID COPPER CONTAMINATION OF A VIA OR DUAL DAMASCENE STRUCTURE

FIELD OF THE INVENTION

The invention relates generally to the metallization process for integrated circuits, and more specifically to the avoidance of dielectric contamination by copper metallization processes.

BACKGROUND OF THE INVENTION

Conventionally, the interconnection between device active areas formed in a semiconductor substrate is provided by conductive metal layers including conductive traces or lines formed in multiple levels of the substrate and interconnected by conductive vertical vias or plugs. First level vias (also referred to as windows) provide electrical connection to the device active areas. Vias at higher levels interconnect adjacent levels of conductive metal traces. Forming these conductive traces and conductive vias requires the use of various process steps, including: polishing, cleaning, deposition, patterning, masking and etching.

Recently, great interest has been shown in the use of copper and copper alloys for metallization within semiconductor devices. Compared with aluminum and its alloys, copper has both beneficial electromigration resistance and a relatively low resistivity of about 1.7 micro-ohm-cm. Unfortunately, copper is a difficult material to etch. Consequently, single and dual damascene processes, in which the copper is deposited in trenches formed in dielectric layers, have been developed to simplify the use of copper interconnects and eliminate metal etching steps. The damascene structures are also referred to as inlaid metallization interconnects. These damascene processes can also employ aluminum alloys in lieu of copper as the conductive material.

The dual damascene structure includes conductive runners substantially parallel to the semiconductor substrate surface and perpendicular conductive vias for interconnecting overlying conductive runners. The first level conductive via (also referred to as a conductive window) contacts an underlying device active area rather than an underlying conductive runner. Thus the dual damascene conductive via provides the same function as the plug structure in a traditional interconnect system.

The conductive vias and the interconnecting conductive runners are formed by forming via openings and interconnecting horizontal trenches within a dielectric layer of the device. The first level vertical openings are typically referred to as windows and the upper layer openings are referred to as windows. When the conductive material is copper, a barrier layer is formed in the openings to prevent copper diffusion from the conductive regions into the dielectric. It is known that without a barrier, copper easily migrates into the dielectric layer and can cause leakage current. These leakage currents can short metallization regions and degrade device performance.

Following the barrier layer formation, a seed layer comprising the same material as the conductive material is formed over the barrier layer to promote electrodeposition of the conductive material. During the electrodeposition step, copper is simultaneously formed in the vias and the trenches and typically overfills the trenches. A chemical-mechanical polishing step removes the copper overfill. In a single damascene process the conductive material is deposited in the vias during a first processing step, and the conductive runners are filled with conductive material during a second processing step.

The dual damascene process eliminates the need to form a conductive plug structure in the vias or windows and an overlying conductive layer during separate processing steps, as taught by the conventional interconnect system.

One disadvantage of the prior art dual damascene process is illustrated with reference to FIG. 1. A dual damascene conductive runner 10 and conductive via 12 are formed in a dielectric layer 16 overlying a semiconductor substrate 18. A dielectric layer 20 is formed over the dielectric layer 16, and a via opening 22 formed therein.

After forming the via opening 22, a pre-barrier layer sputter cleaning process is performed to remove any copper oxide that might have formed on a surface 23 of the conductive runner 10 exposed through the via opening or window 22. Copper oxide can form on the surface 23 during several of the normal fabrication steps performed in the processing facility. The copper oxide can form after the chemical/mechanical polishing (CMP) step that removes copper overfill as the wafer is transported from the CMP processing tool to the deposition tool. The copper oxide can also form during subsequent annealing steps or during deposition of the dielectric layer 20. Typically, the dielectric layer 20 is formed from an oxide-based material and therefore may include oxygen-containing chemistries that promote the oxide formation. The copper oxide can form on the surface 23 during formation of the via opening 22 by etching processes that include oxygen chemistries. The copper oxide can develop after formation of the via opening 22 due to interactions between the copper with the ambient oxygen. It is advantageous to remove the copper oxide to improve the conductivity between the conductive runner 10 and the overlying conductive surface, which is typically a conductive via according to the dual damascene process.

According to the prior art, during the pre-sputter cleaning process, argon ions are directed at the surface 23 to sputter away the copper oxide. However, if the sputtering/cleaning process is not terminated immediately after all the copper oxide has been removed or if the copper oxide is non-uniform across the exposed surface, then copper from the underlying conductive runner 10 is sputtered off and deposited onto sidewalls 24 of the via opening 22, as illustrated by an arrowhead 26. As discussed above, this copper contaminates and diffuses into the dielectric layer 20, potentially causing short circuits and degrading device performance.

According to conventional dual damascene processing, after the pre-sputter clean step copper or another conductive metal is formed in the via opening 22 for interconnecting the conductive runner 10 with a conductive runner subsequently formed in the upper region of the dielectric layer 20.

A known technique for avoiding the copper contamination of the dielectric layer requires the formation of a capping layer over the copper conductive layer prior to the cleaning step. See for example, U.S. Pat. No. 6,114,243 (Gupta, et al). After the conductive runner 10 is formed and the upper surface of the dielectric layer 16 is planarized to remove copper overfill, a recess (not shown) is etched into the conductive runner 10 and filled with a conductive capping layer. The material of the capping layer fills the recess and extends over the upper surface of the dielectric layer 16 (referred to as the field region). In subsequent masking and etching steps the capping material is removed from all regions of the upper surface except within the recess. The overlying dielectric layer 20, via opening 22 and trenches (not shown) are then conventionally formed by etching processes. The capping layer prevents copper contamination onto the sidewalls 24 during these etching steps.

Although this described prior art technique limits copper sputtering onto the via opening sidewalls during the etching process, it is desired to simplify the process and lower the cost by avoiding the need for multiple additional masking, patterning and etching steps as taught by Gupta et. al.

BRIEF SUMMARY OF THE INVENTION

A method for forming an integrated circuit interconnect according to the teachings of the present invention comprises forming a via opening for a conventional metallization interconnect or for a dual damascene process. A barrier layer is formed on the bottom surface of the via opening and then sputtered onto the sidewalls. Next the cleaning step (also referred to as pre-sputter clean) removes copper oxide on the exposed bottom surface of the via opening. During this cleaning step copper is sputtered onto the via opening sidewalls, but is prevented from diffusing into the dielectric layer that defines the sidewalls by the barrier material that was previously sputtered from the bottom surface onto the sidewalls. The material of the barrier layer can be conductive or non-conductive.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

Figure 1:
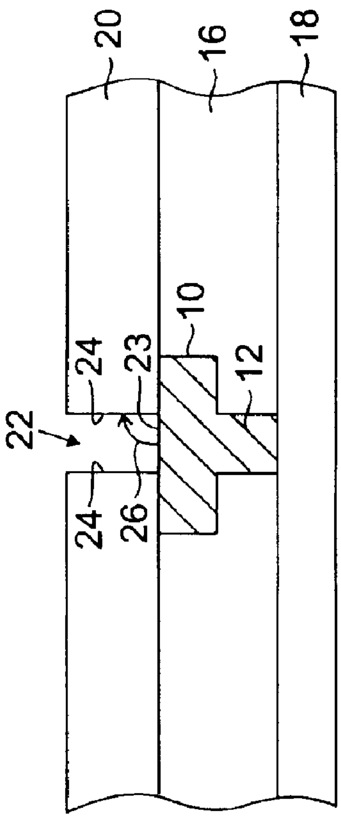
FIG. 1 is a cross-sectional view of a prior art semiconductor substrate during a fabrication step.
Figure 2:
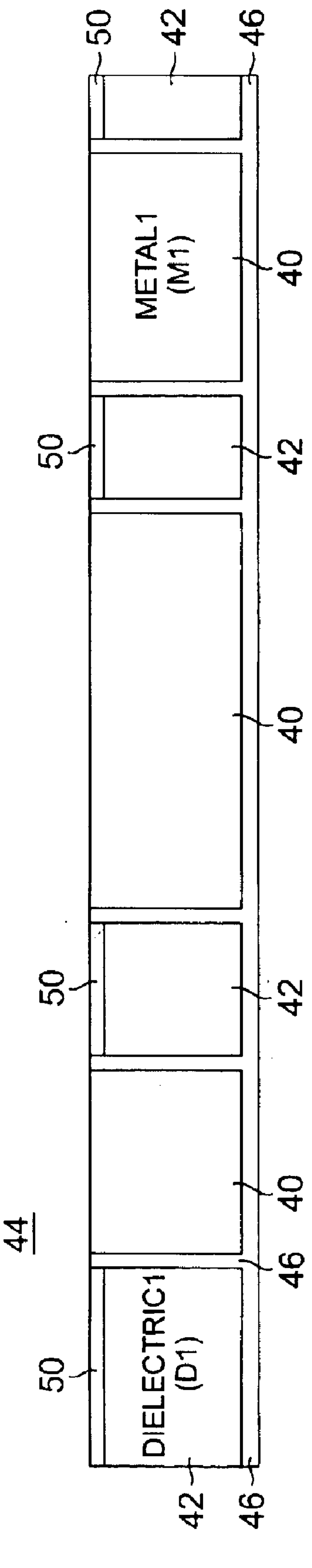
FIGS. 2 through 8 are cross-sectional views of a semiconductor substrate according to a first embodiment of the present invention during sequential processing steps.

FIG. 2 illustrates an interconnect structure, comprising a plurality of metal-1 runners 40 formed in a dielectric layer 42 (referred to as dielectric-1), of a semiconductor substrate 44. The plurality of metal-1 runners 40 extend into and out from the plane of the paper. Although not shown in FIG. 2, the metal-1 runners 40 are conventionally electrically connected to underlying vertical conductive vias or windows, which in turn are connected to underlying device regions. Prior to deposition of the copper for the metal-1 runners 40, a barrier layer 46 (preferably of tantalum or tantalum nitride) and a seed layer (not shown) are formed between the copper and the adjacent dielectric surfaces. The barrier layer 46 prevents diffusion of the copper from the metal-1 runners 40 into the dielectric material of the dielectric layer 42, thus reducing the potential for leakage current within the dielectric. The seed layer is formed over the barrier layer 46 to promote the deposition of copper for the metal-1 runners.

Most semiconductor processes utilize a conventional patterned photomask in conjunction with a photo-sensitive resist material to define regions of the substrate for processing. It is also known to use a hard mask layer in lieu of the photoresist layer. The remnants of such a hard mask layer 50 after forming the metal-1 runners 40 are shown in FIG. 2.

Figure 3:
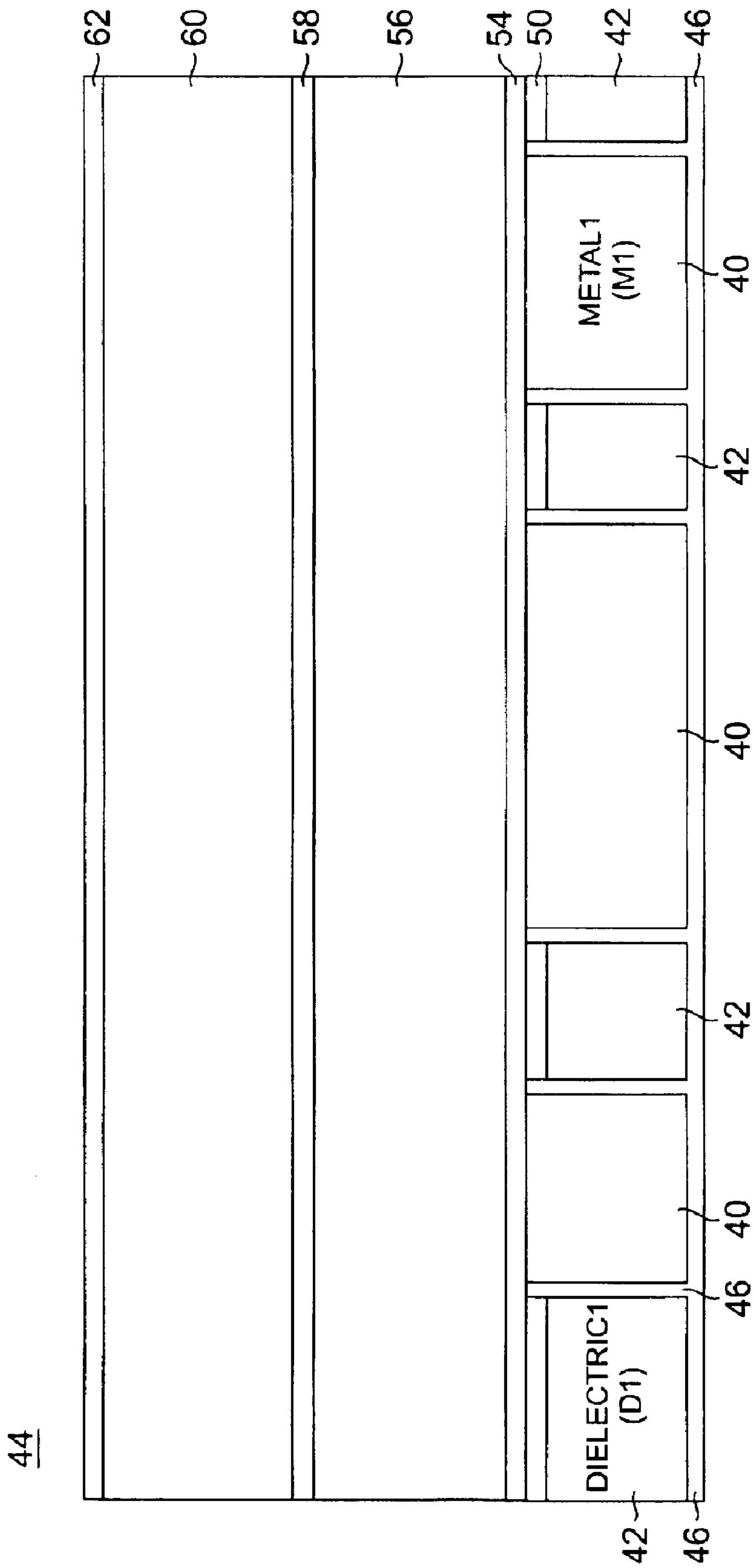

The dual damascene process for forming the second level vias and runners begins with the formation of a barrier layer 54 (preferably of titanium-nitride) as illustrated in FIG. 3. Next a dielectric layer 56, preferably having a relatively low dielectric constant, is formed over the barrier layer 54. The use of a low-dielectric constant material is advantageous to reduce inter-layer capacitance, but it is not required according to the teachings of the present invention. Suitable candidate materials for the dielectric layer 56 include organo-silicates, polymeric materials, low-dielectric constant silicon-dioxide, Black Diamond™ dielectric material, and Coral™ dielectric material, Nano-glass™ dielectric material, xerogels, and aerogels, as well as other organic and inorganic materials known to those skilled in the art. An optional etch stop layer 58, preferably of silicon-nitride or silicon carbide, is formed over the dielectric layer 56.

A dielectric layer 60 is formed over the etch stop layer 58. Advantageously, the dielectric layer 60 is also formed of a low-dielectric constant material, preferably of the same material as the dielectric layer 56. A hard mask layer 62 is formed over the surface of the dielectric layer 60. As discussed above, conventional photoresist and masking material can be used in lieu of the hard mask layer 62.

Figure 4:
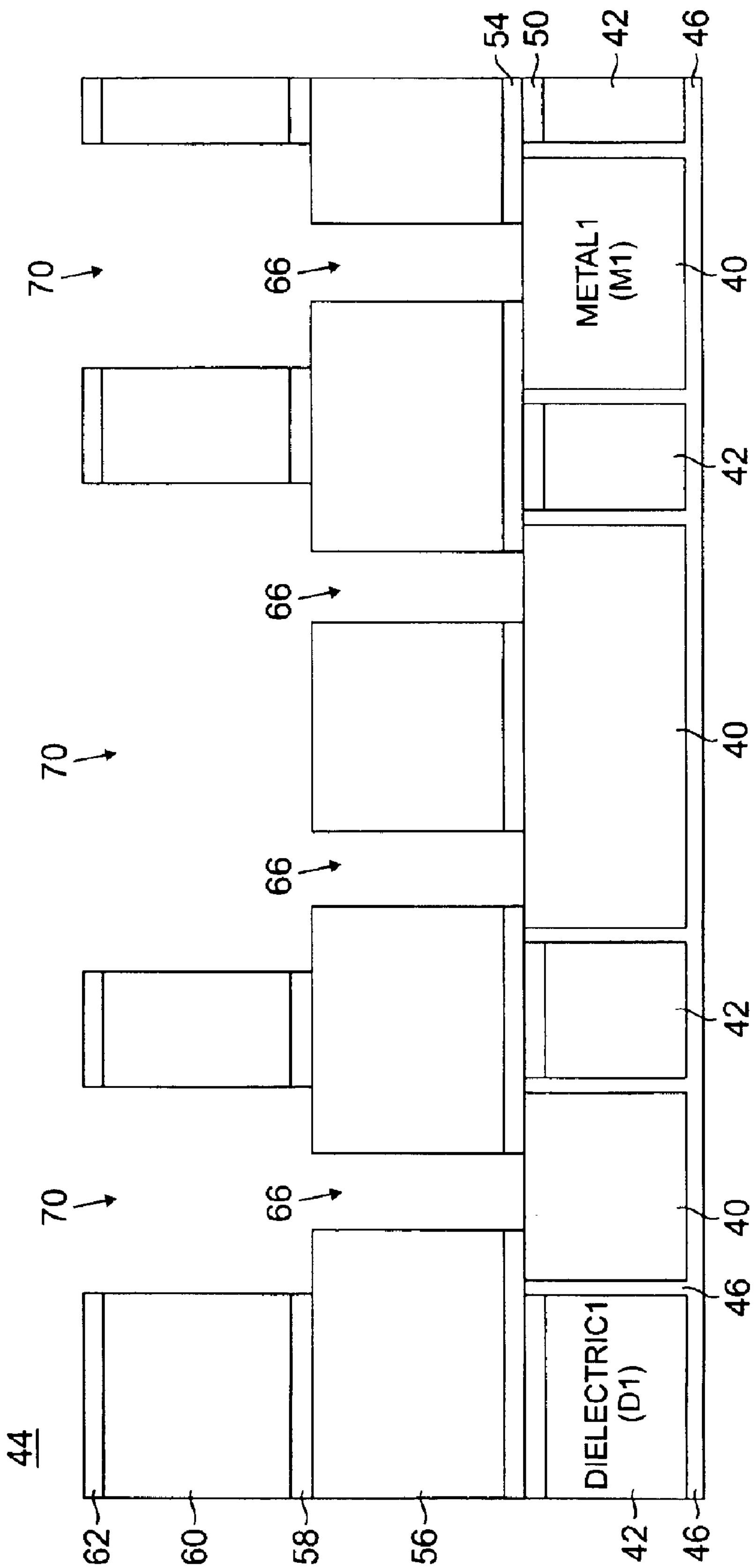

As illustrated in FIG. 4, during subsequent process steps, metal-2 via openings 66 are formed in the dielectric layer 56 and metal-2 trenches 70 are formed in the dielectric layer 60. These via openings 66 and the trenches 70 can be formed in either order using conventional photolithography and etching techniques. The feature processing is performed such that the via openings 66 touch the upper surface of the copper conductive runner 40 by breaking through the barrier layer 54. Similarly, at the base of the metal-2 trenches 70 the etch stop layer 58 has been removed.

Figure 5:
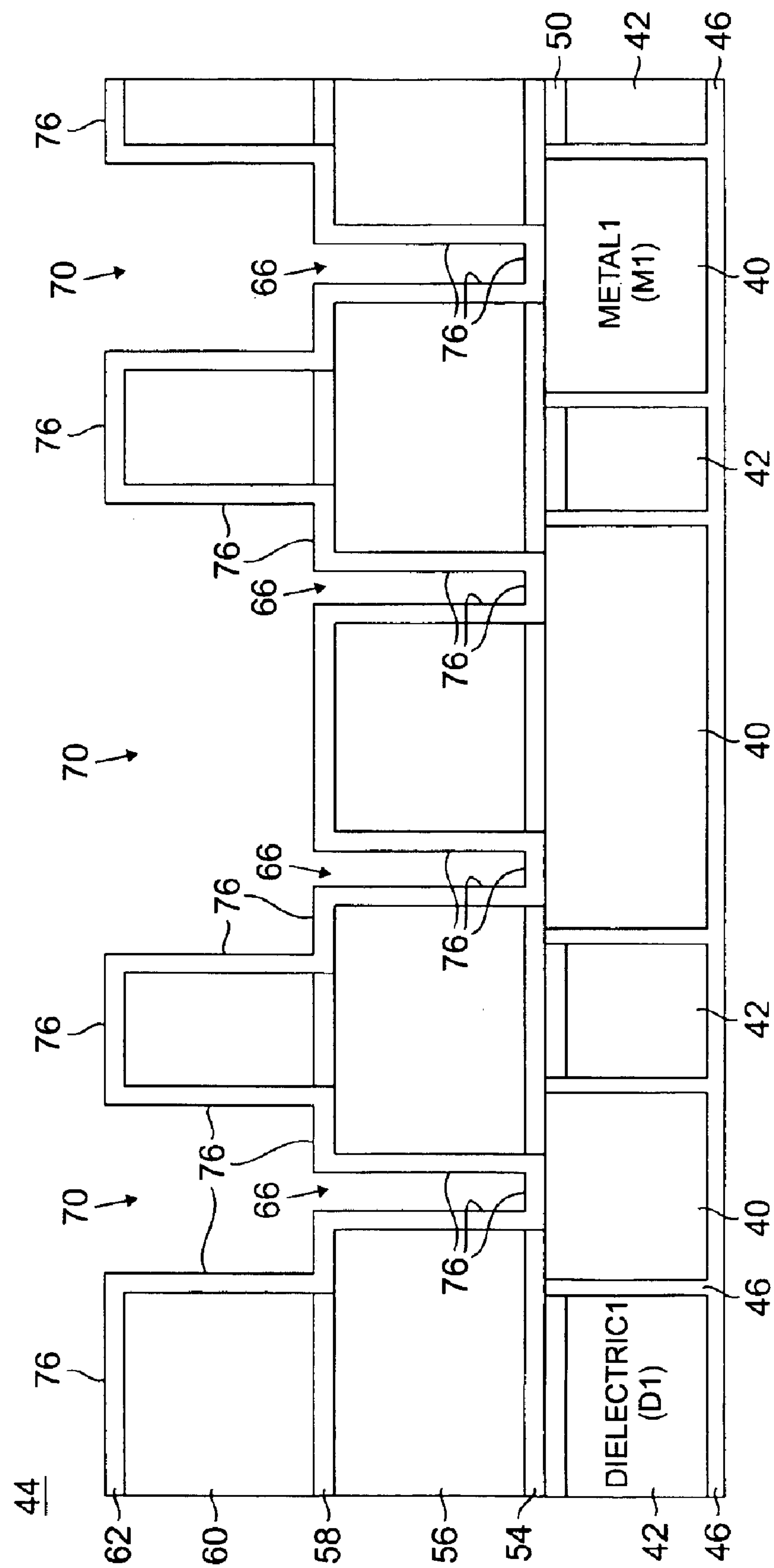

As shown in FIG. 5, a sacrificial contamination prevention layer 76 is formed by deposition over the exposed surfaces of the semiconductor substrate 44, including the top surfaces and the sidewalls of the various features. A contamination prevention layer 76 formed by sputtering (physical vapor deposition) is about 50 to 100 Angstroms thick. For other depositions methods, such as chemical vapor deposition, the thickness may be tens of Angstroms. According to the teachings of the present invention, the contamination prevention layer 76 prevents copper contamination of the dielectric layers 56 and 60 during latter processing steps, as will be described below. The material of the contamination prevention layer 76 can be selected from among titanium, tantalum, tungsten, or their nitrides or their silicon-nitrides, silicon-dioxide, silicon-nitrides (conductive or non-conductive), silicon carbides (conductive or non-conductive), or a combination of these candidate materials. All of these materials have diffusion rates that are lower in the material of the dielectric layers 56 and 60 than the copper diffusion rate.

Figure 6:
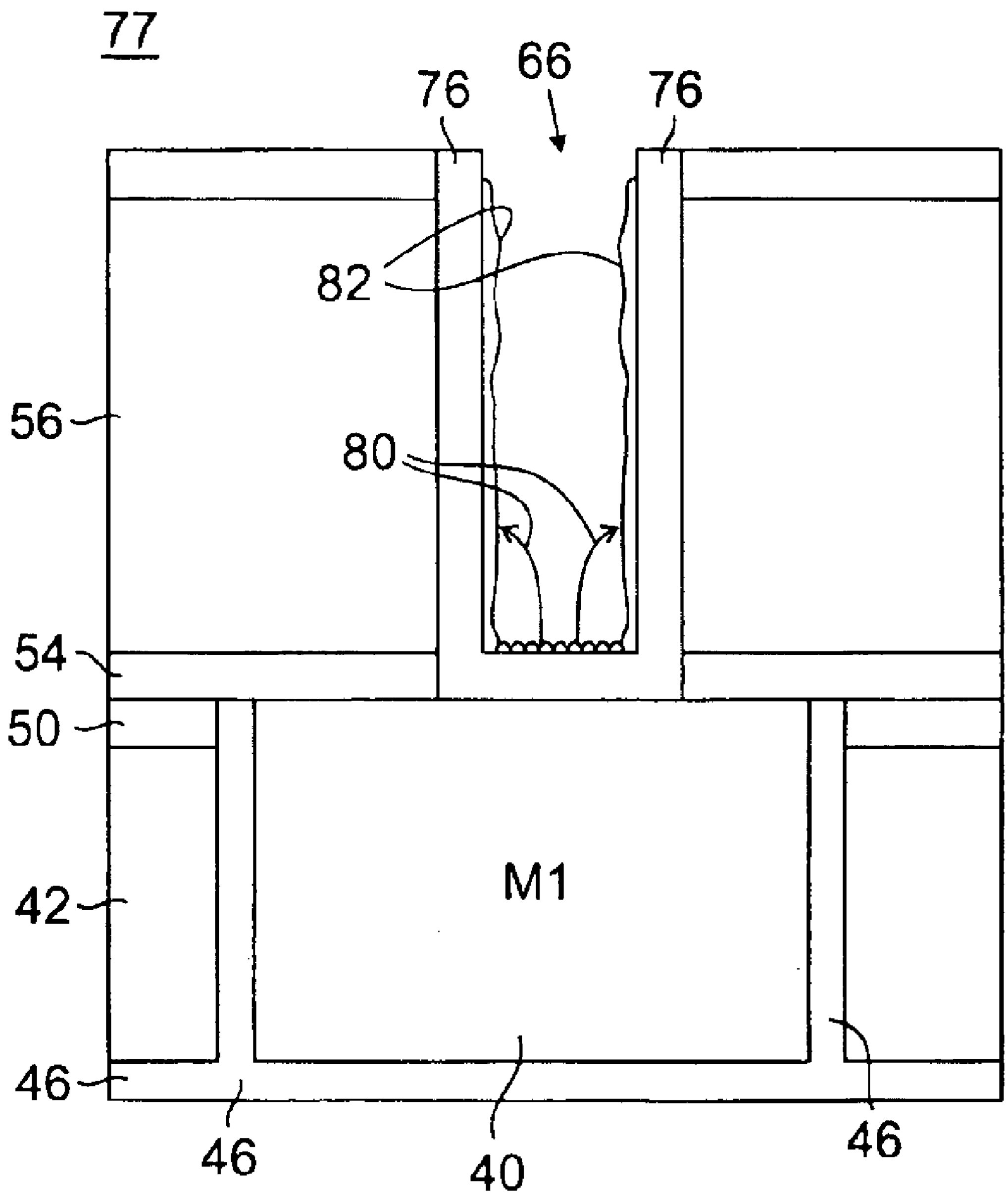

FIG. 6 illustrates a region 77 of the semiconductor substrate 44, including the contamination protection layer 76 on the bottom and sidewall surfaces of the via opening 66. Next, a sputter etch cleaning step, using argon ions, for example, removes the contamination prevention layer 76 from the bottom surface of the via opening 66, and as shown by arrowheads 80 deposits the material of the copper contamination layer 76 on the sidewalls 82.

Conventionally, the next process step cleans the top surface of the metal-1 runner 40 to remove any oxides or other contaminants that may have formed there due to exposure of the semiconductor substrate to an oxygen containing atmosphere during and between the various processing steps that followed formation of the metal-1 runner 40. It is considered advantageous to remove these contaminants as they can create undesired resistance within the interconnect structure between the upper surface of the metal-1 runner 40 and the overlying conductive via to be formed later as described below. During this cleaning step, referred to as the pre-barrier deposition cleaning step or the pre-sputter clean step, argon ions, for example, are sputtered into the via opening 66 to remove the copper oxide. As the oxide is removed, copper atoms from the upper surface of the metal-1 runner 40 can also be sputtered onto the sidewalls of the via opening 66. However, any copper that may be sputtered cannot diffuse into the dielectric 56 due to the barrier formed on the sidewalls by the previous sputtering of the contamination prevention layer 76. Thus according to the teachings of the present invention, prior sputtering of the material of the contamination prevention layer 76 onto the sidewalls 82, as illustrated in FIG. 6, prevents copper contamination of the dielectric layer 56 during the pre-sputter cleaning step.

Although the process of the present invention has been described with reference to FIG. 6 and the region 77 of the substrate 44, the sputtering of the contamination protection layer 76 is performed over the entire substrate 44. Thus the material of the contamination protection layer 76 is sputtered onto the sidewalls of each of the via openings 66 and the sidewalls of the trenches 70.

In a preferred embodiment of the present invention, the two processing steps (the first to remove the material of the contamination prevention layer 76 onto the sidewalls of the via openings 60 and the second the cleaning step to remove the copper oxide from the metal-1 runner 40 that forms the bottom surface of the via openings 60) are performed in immediate succession in the same processing tool or can be executed as an integral step.

In another embodiment, hydrogen or a hydrogen-containing species is added to the processing chamber in which the pre-barrier deposition cleaning step is performed (after the contamination prevention layer 76 has been sputtered onto the sidewalls) to "reduce" the copper oxide that has formed on the surface of the metal-1 runners 40 (and the other runners formed in the substrate 44), that is, the oxide is removed by combining with the hydrogen species and pumped from the chamber.

The material of the contamination prevention layer 76 can be non-conductive since it is removed from the bottom surface of the via openings 66, and therefore does not interfere with the electrical connection between the conductive material later formed in the via openings 66 and the underlying metal-1 runners 40. Advantageously, once the copper contamination prevention layer 76 and the copper oxide have been removed, subsequent processing steps, as described below, allow the copper (or other conductive material) formed in the via openings 66 to directly contact the underlying copper of the metal-1 runners 40. Candidate non-conductive materials include: silicon-nitride, silicon carbide, silicon-oxynitride, silicon oxycarbide, silicon carbo-nitride and others known to those skilled in the art.

In another embodiment, the material of the contamination prevention layer 76 is conductive and can be formed in the same processing tool where a barrier layer 88 (similar to the barrier layer 54 described above) is subsequently deposited as described below. The refractory materials identified above for use in the contamination prevention layer 76 are conductive and suitable for use in this embodiment, however, such materials are oxygen sensitive and "getter" oxygen from the clean room environment, quickly forming their own oxides. These oxides vary from partially conductive to non-conductive. Those that are non-conductive add undesirable resistance into the interconnect structure of the semiconductor substrate 44. Thus it is advantageous to perform the contamination prevention layer deposition, pre-barrier clean and subsequent barrier and seed deposition steps in one sequential operation. It is suggested that these sequential steps be undertaken without breaking the processing vacuum between the constituent steps. Thus use of a conductive material for the contamination prevention layer 76 offers a more efficient process according to the teachings of the present invention.

Figure 7:
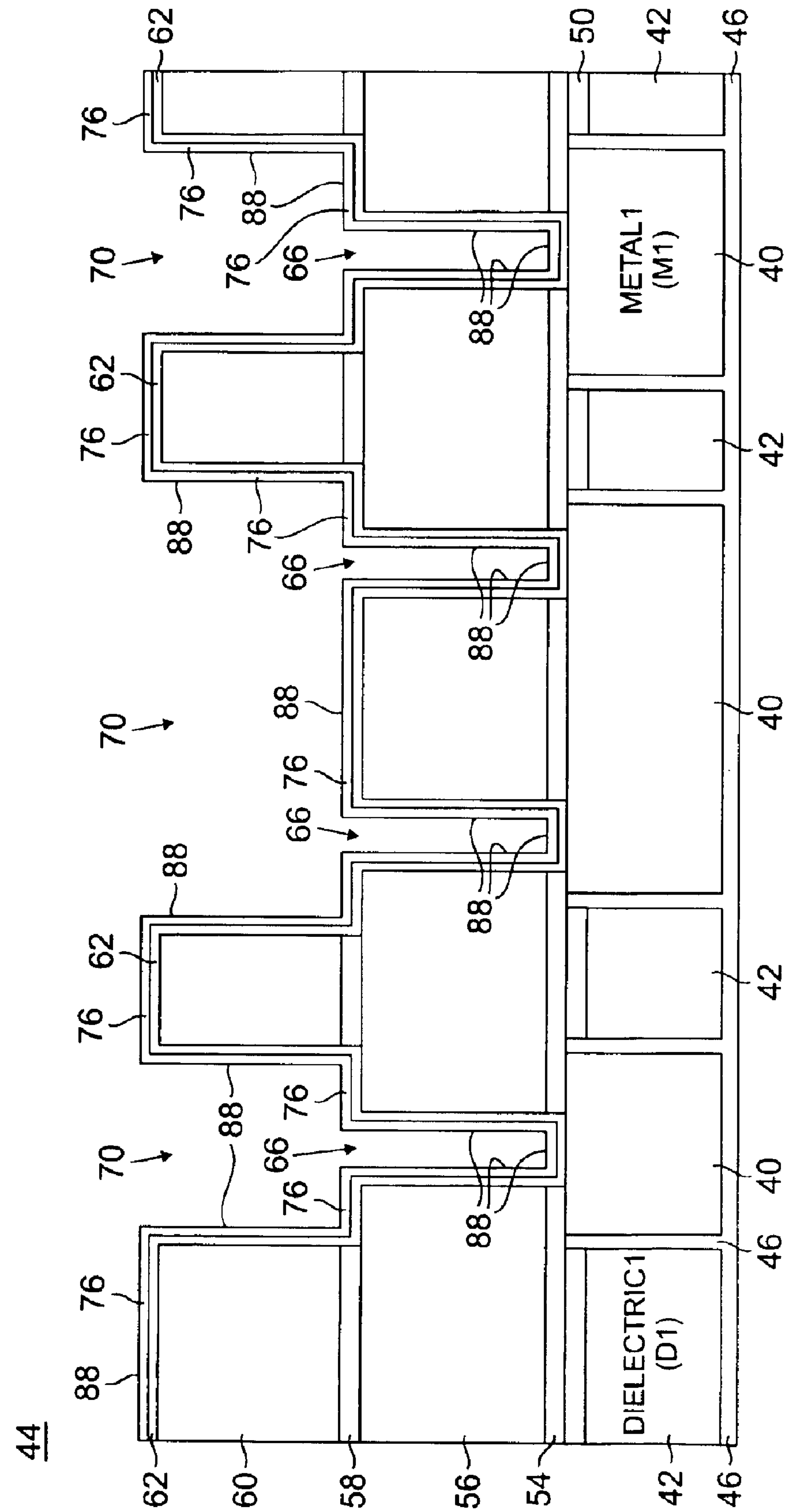

Following the steps of sputtering the barrier contamination layer 76 from the bottom surface of the via openings 66 onto the sidewalls and cleaning the copper surface during the pre-barrier deposition cleaning step described above, the process of forming the interconnect structure continues as illustrated in FIG. 7. A barrier layer 88 is formed, conventionally by sputtering, on the exposed surfaces of the via openings 66 and the trenches 70, including the sidewalls and the bottom surfaces, and on the top surface of the semiconductor substrate 44. The barrier material on the top surface is removed according to known processing steps. Tantalum, tantalum-nitride, titanium and titanium-nitride are among the candidate materials for the barrier layer 88. A barrier layer 88 formed by sputtering (physical vapor deposition) is about 250 to 350 Angstroms thick.

Next a thin copper seed layer (not shown in FIG. 7) is deposited, preferably by sputtering. The seed layer is required as a starting layer for the electroplating of copper into the via openings 66 and the trenches 70. The material of both the barrier layer 88 and the seed layer can also be deposited by conventional chemical vapor deposition and electroplating processes, or by other processes known to those skilled in the art.

Figure 8:
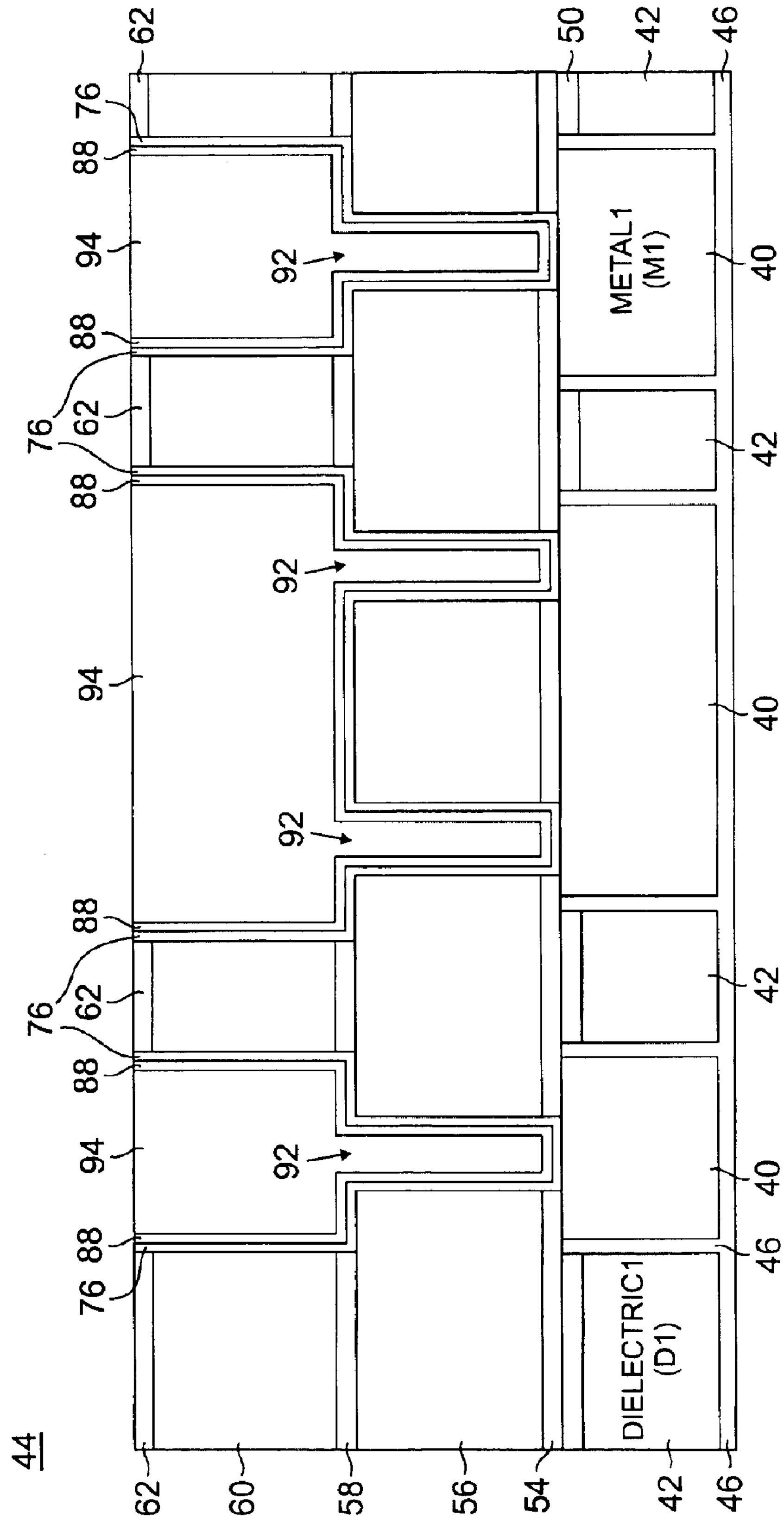

Copper is electroplated into the via openings 66 and the trenches 70 to form a metal-2 layer comprising metal-2 vias 92 and metal-2 runners 94. See FIG. 8. Note that the metal-2 vias are in electrical contact with the underlying metal-1 runners 40. To remover the copper overfill formed during the electroplating process, the substrate is chemically/mechanically polished, thus planarizing the top surface of the semiconductor substrate 44 as shown in FIG. 8.

According to a single copper damascene process, copper is deposited in the via openings 66 in a separate processing step from the deposition of copper in the trenches 70. In this situation, the upper surface of the copper formed in a via opening to create a conductive via may become contaminated with copper oxide. Thus the teachings of the present invention can employed to form the contamination barrier layer over the conductive via, and sputter the material of the contamination barrier layer onto the sidewalls of the trench 70. Now when the upper surface of the conductive via is sputter cleaned to remove the oxides and other contaminants, the barrier layer material on the sidewalls of the trench 70 prevents diffusion of any sputtered copper into the dielectric layer 60.

Figure 9:
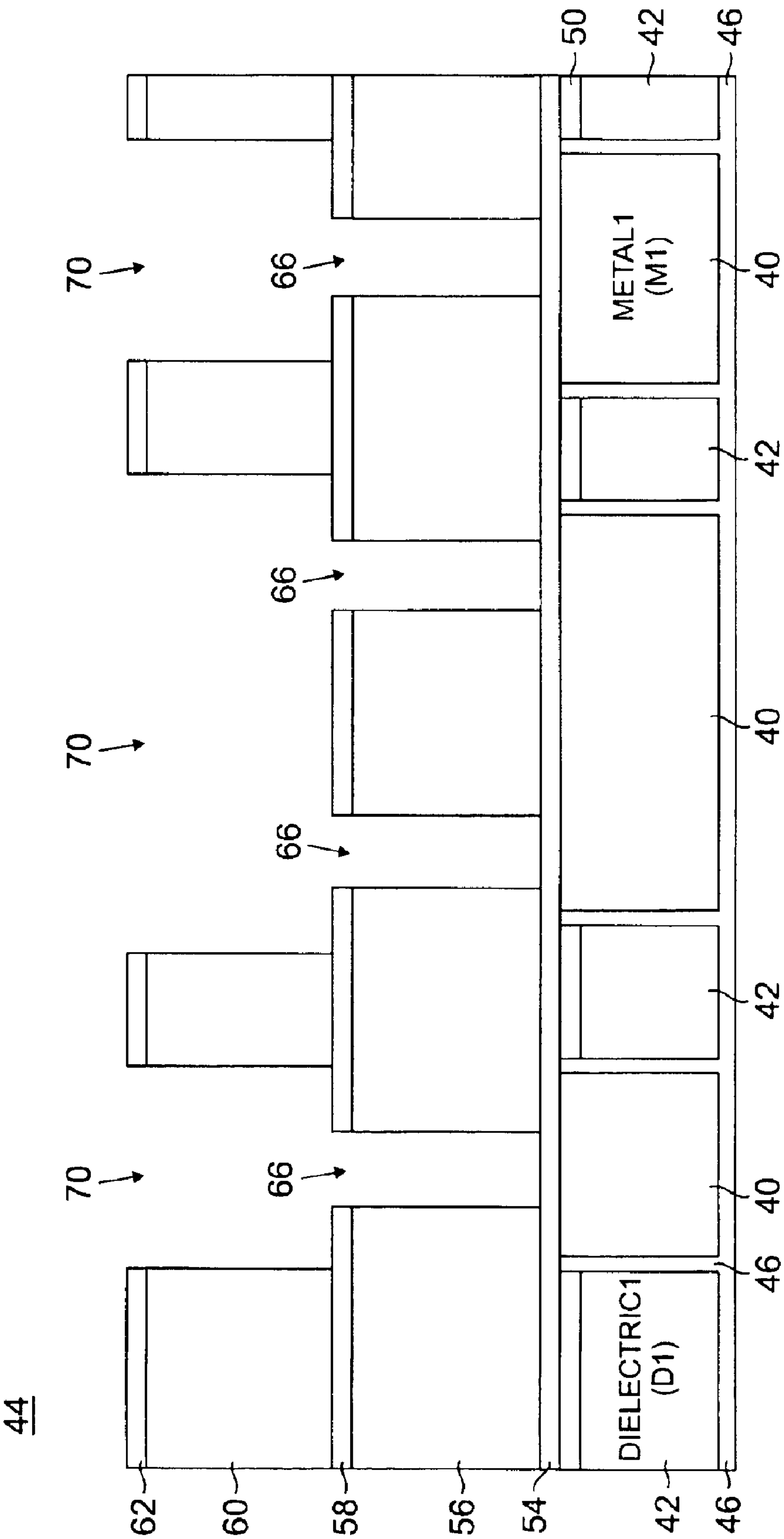
FIGS. 9 through 13 are cross-sectional views of a semiconductor substrate according to a second embodiment of the present invention during sequential processing steps.

An alternative embodiment of the present invention is illustrated in FIGS. 9 through 13. The process flow for this second embodiment is identical to the previous embodiment as shown in FIGS. 2 through 4; FIG. 9 begins the process flow steps for the second embodiment.

When the trenches 70 are formed, the etching process stops at the etch stop layer 58. Thus, according to this second embodiment, neither the etch stop layer 58 on the bottom surface of the trenches 70 nor the barrier layer 54 on the bottom surface of the via openings 66 is removed. By comparison, note that in the previous embodiment (see FIG. 4) a second etching step removed the region of the barrier layer 54 at the bottom of each of the plurality of via openings 66 and the etch stop layer 58 at the bottom of the trenches 70.

Figure 10:
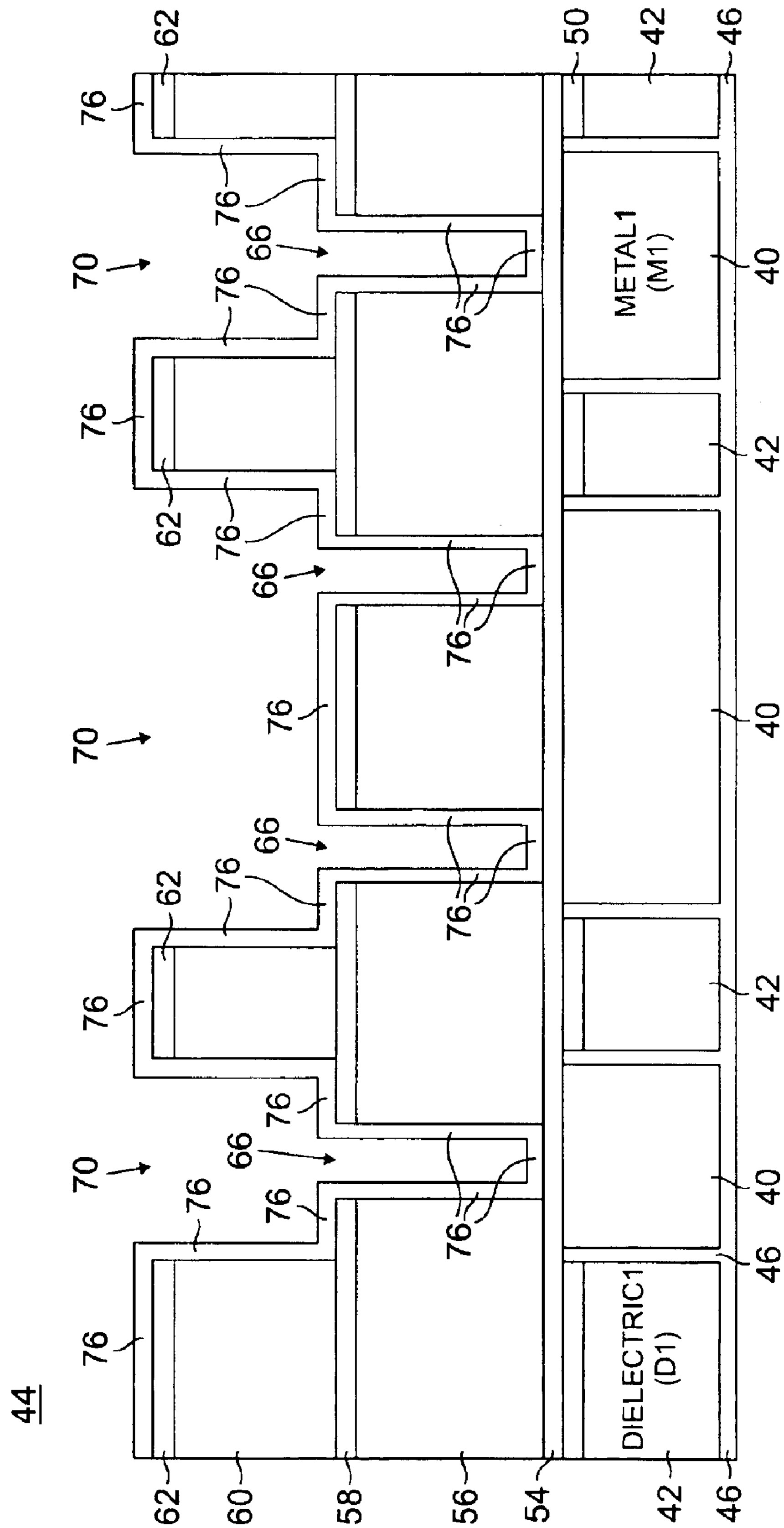

In FIG. 10 the contamination prevention layer 76 is formed, typically by physical vapor deposition (sputtering), on all exposed surfaces, including the sidewalls and the bottom surfaces of the via openings 66 and the trenches 70, and the top surface of the semiconductor substrate 44.

Figure 11:
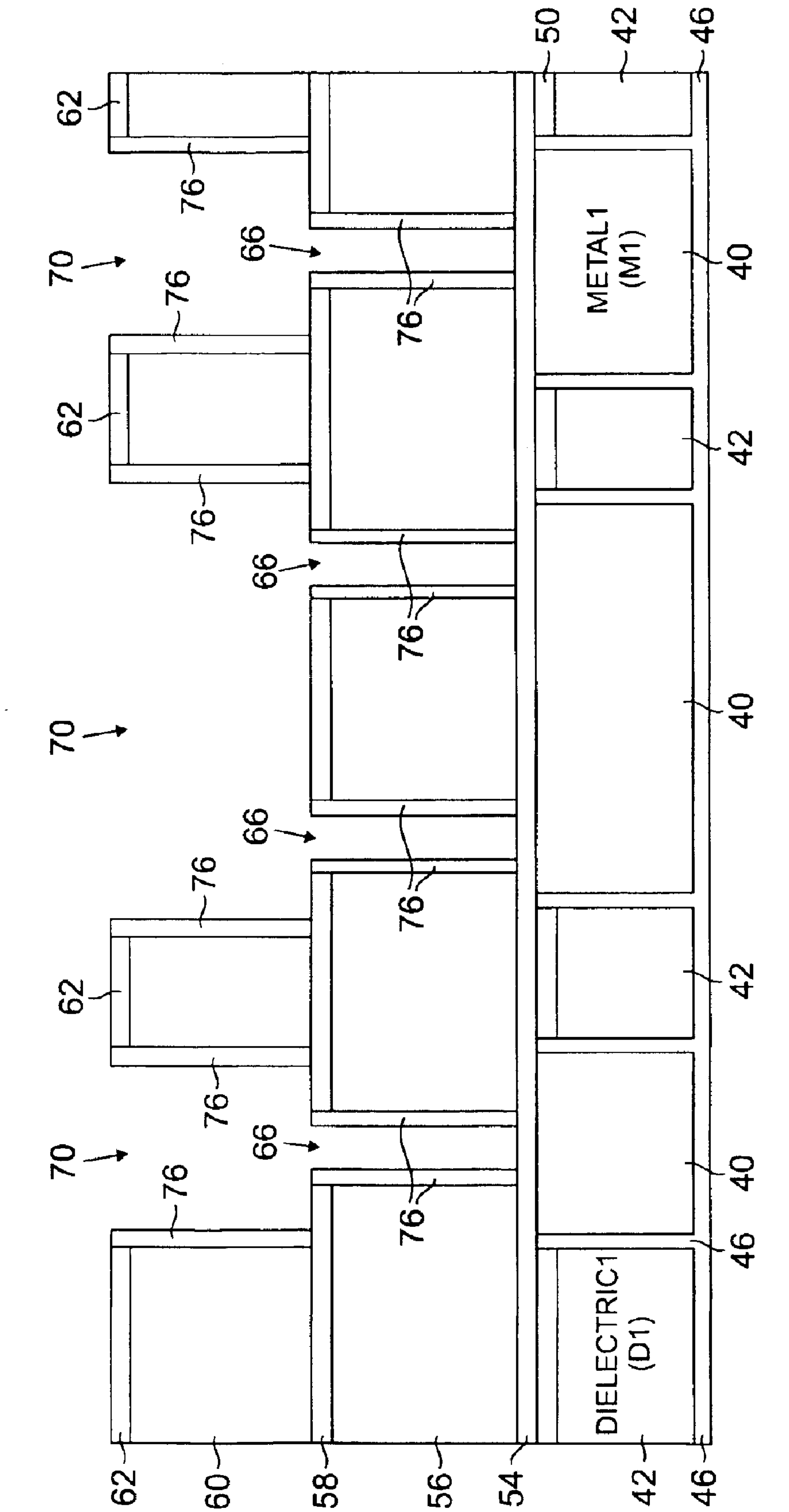

The substrate is sputter etched to remove the regions of the barrier layer 54 exposed on the bottom of the via openings 66, the regions of the etch stop layer 58 exposed on the bottom of the trenches 70, and the contamination prevention layer 76 that overlies these regions. The resulting substrate is illustrated in FIG. 11. As described above in conjunction with FIG. 6, during the sputter etch process, the material of the contamination prevention layer 76 is deposited on the sidewalls of the via openings 66 to serve as a barrier to the diffusion of any copper that may be deposited on the sidewalls during later process steps.

Figure 12:
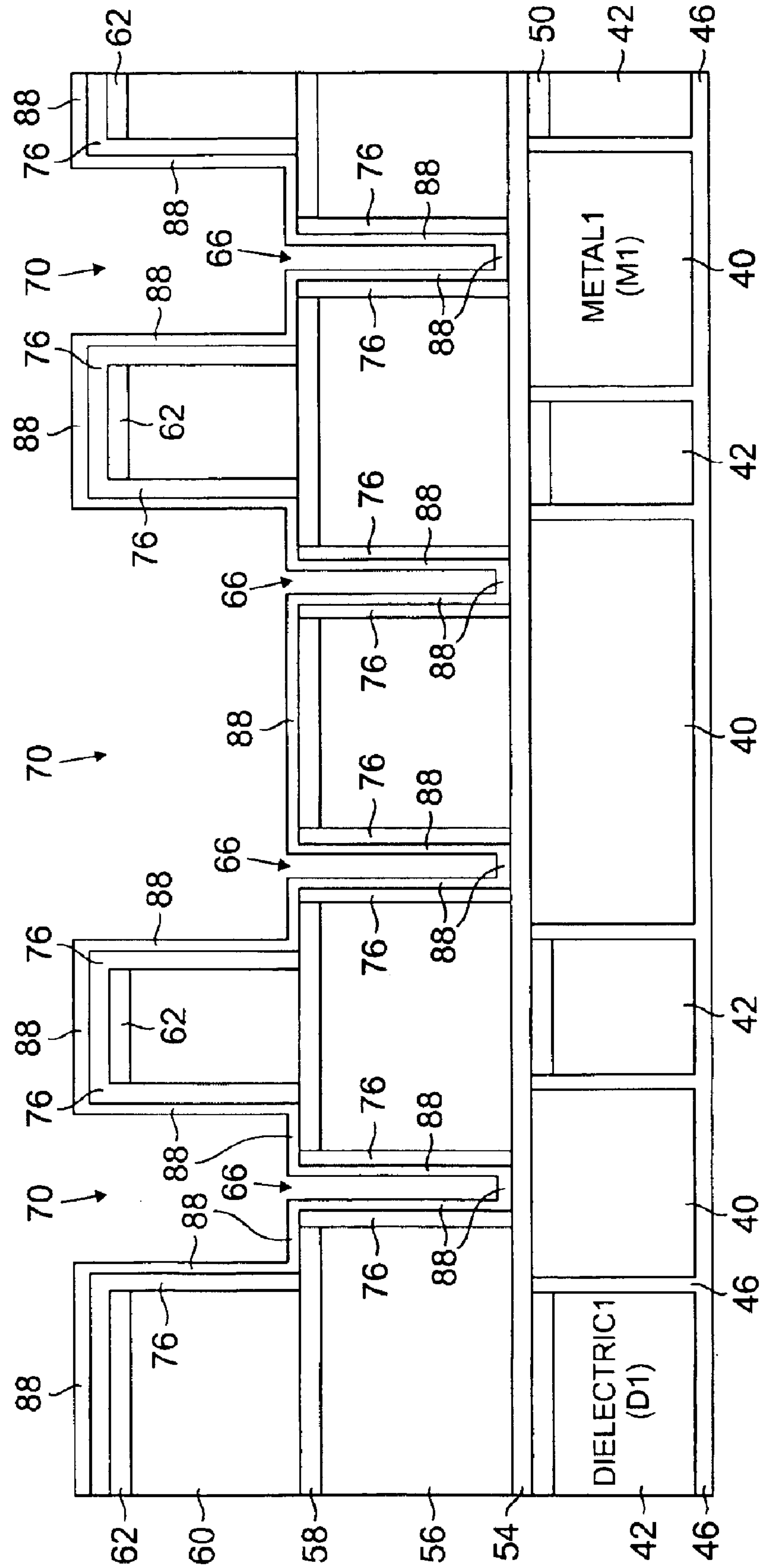
Figure 13:
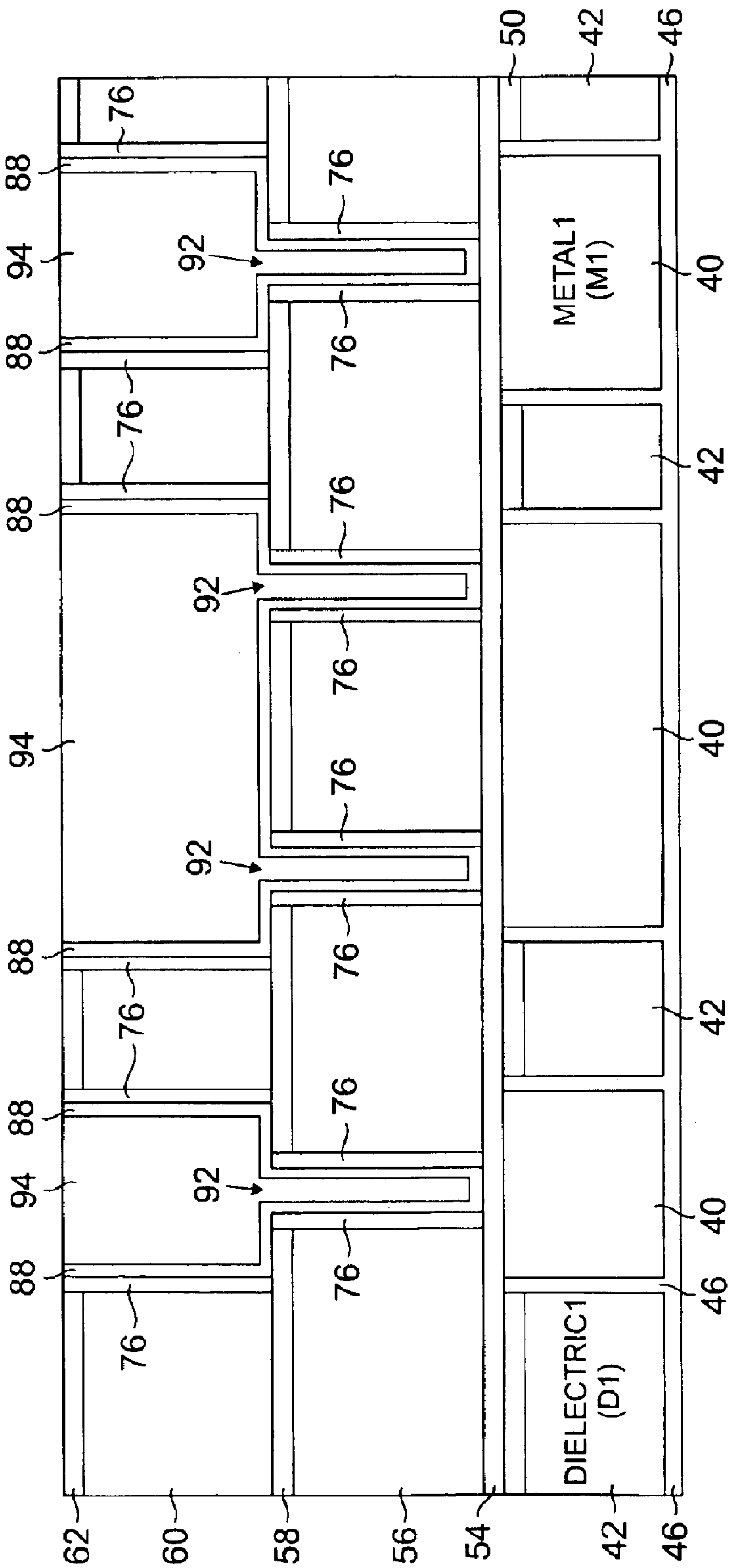

FIG. 12 illustrates the substrate after formation of the barrier layer 88, conventionally by sputtering, on the exposed surfaces of the via openings 66, the trenches 70 and the upper surface of the dielectric layer 60. Tantalum, tantalum-nitride, titanium and titanium-nitride are among the candidate materials for the barrier layer 88. Next a thin copper seed layer (not shown in FIG. 12) is deposited, preferably by sputtering. The seed layer is required as a starting layer for the electroplating of copper into the via openings 66 and the trenches 70. The material of both the barrier layer 88 and the seed layer can also be deposited by conventional chemical vapor deposition, by electroplating processes, or by other processes known to those skilled in the art.

Copper is electroplated into the via openings 66 and the trenches 70 to form a metal-2 layer comprising metal-2 vias 92 and runners 94. See FIG. 13. Note that the metal-2 vias are in electrical contact with the underlying metal-1 runners 40. To remove the copper overfill formed during the electroplating process the semiconductor substrate 44 is chemically/mechanically polished to planarize the top surface. The material of the barrier layer 88 that had been previously deposited on the top surface of the dielectric layer 60 is also removed during the chemical/mechanical polishing step.

The teachings of the present invention can also be applied to aluminum interconnects, in particular the use of aluminum in the metal runners of a damascene process. Although the diffusion rate for aluminum in the material of the dielectric layers 56 and 60 is lower than the diffusion rate of copper, the teachings of the present invention can be advantageously applied to aluminum interconnects.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt a particular situation to the teachings of the present invention without departing from its essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for preventing contamination of a dielectric caused by diffusion of a contaminating material into the dielectric, wherein the dielectric has an opening therein, and wherein the contaminating material forms the bottom surface of the opening, said method comprising:

(a) forming a barrier layer on the bottom surface of the opening overlying the contaminating material;

(b) removing portions of the barrier layer from the bottom surface to the sidewalls of the opening; and (c) then cleaning the bottom surface of the opening during which the contaminating material may be deposited on the sidewalls of the opening, wherein the contaminating material is prevented from diffusing into the dielectric material by the barrier layer material, and wherein the cleaning is performed by adding to a processing chamber an environment containing a hydrogen species.

2. The method of claim 1 wherein the contaminating material comprises copper.

3. The method of claim 1 wherein the step (a) further comprises forming the barrier layer on the sidewalls and the bottom surface of the opening.

4. The method of claim 1 wherein the step (a) further comprises depositing the barrier layer on the bottom surface of the opening.

5. The method of claim 4 wherein the step (a) further comprises depositing the barrier layer on the bottom surface of the opening using a physical vapor deposition process.

6. The method of claim 1 wherein the material of the barrier layer is selected from among titanium, titanium nitride compounds, titanium silicide-nitride compounds, titanium carbide compounds, tantalum, tantalum nitride compounds, tantalum silicide-nitride compounds, tantalum carbide compounds, tungsten, tungsten nitride compounds, tungsten silicide-nitride compounds, tungsten carbide compounds, or a combination of any of the aforementioned.

7. The method of claim 1 wherein the step (b) comprises sputtering the barrier layer with particles.

8. The method of claim 7 wherein the particles comprise argon ions.

9. The method of claim 1 wherein the step (c) further comprises sputtering the bottom surface with particles.

10. The method of claim 9 wherein the particles further comprise argon ions.

11. The method of claim 1 wherein the step (c) removes deleterious material from the bottom surface of the opening.

12. The method of claim 11 wherein the deleterious material comprises oxides of the contaminating material.

13. The method of claim 1 wherein the rate of diffusion of the barrier layer material in the dielectric is lower than the rate of diffusion of the contaminating material in the dielectric.

14. The method of claim 1 wherein the material of the barrier layer removed to the sidewalls of the opening prevents leakage currents in the dielectric caused by the presence of the contaminating material on the sidewalls of the opening.

15. A method for forming a conductive region in an integrated circuit device, comprising:

providing a semiconductor substrate having semiconductor devices and conductive interconnects therein;

forming a dielectric layer overlying the semiconductor substrate;

forming an opening in the dielectric layer, wherein the opening overlies a conductive interconnect such that the bottom surface of the opening is formed by the conductive interconnect;

forming a barrier layer on the bottom surface of the opening;

removing at least a portion of the barrier layer such that barrier layer material is deposited on the sidewalls of the opening;

then cleaning the bottom surface of the opening by adding to a processing chamber an environment containing a hydrogen species; and forming the conductive region in the opening, such that the conductive region is in electrical contact with the underlying conductive interconnect.

16. The method of claim 15 wherein the material of the conductive interconnect is selected from among copper and aluminum.

17. The method of claim 15 wherein the opening is a substantially vertical via, and wherein the formed conductive region comprises a conductive via.

18. The method of claim 15 wherein the opening is a trench, and wherein the formed conductive region comprises a conductive runner.

19. The method of claim 15 wherein the step of forming the barrier layer further comprises forming the barrier layer on the bottom surface and the sidewalls of the opening.

20. The method of claim 15 wherein the step of forming the barrier layer further comprises forming the barrier layer using a physical vapor deposition process.

21. The method of claim 15 wherein the material of the barrier layer comprises a refractory metal.

22. The method of claim 15 wherein the material of the barrier layer is selected from among, titanium, titanium nitride compounds, titanium silicide-nitride compounds, titanium carbide compounds, tantalum, tantalum nitride compounds, tantalum silicide-nitride compounds, tantalum carbide compounds, tungsten, tungsten nitride compounds, tungsten silicide-nitride compounds, tungsten carbide compounds, or a combination of any of the aforementioned.

23. The method of claim 15 wherein the material of the barrier layer is selected from between a substantially non-conductive material and a substantially conductive material.

24. The method of claim 15 wherein the material of the barrier layer is substantially non-conductive, comprising a material selected from among silicon-nitride, silicon carbide, silicon oxynitride, silicon oxycarbide and silicon carbo-nitride.

25. The method of claim 15 wherein the material of the barrier layer has a lower diffusion rate through the dielectric than the material of the underlying conductive interconnect.

26. The method of claim 15 wherein the step of removing portions of the barrier layer further comprises sputtering the barrier layer.

27. The method of claim 15 wherein the step of cleaning the bottom surface further comprises sputtering the bottom surface.

28. The method of claim 15 wherein the step of cleaning the bottom surface further comprises removing deleterious material from the conductive interconnect.

29. The method of claim 28 wherein the deleterious material comprises oxides of the material of the conductive interconnect.

30. The method of claim 15 wherein cleaning the bottom surface of the opening causes material of the underlying conductive interconnect to be deposited on the sidewalls of the opening, and wherein the barrier layer material substantially prevents the material of the underlying conductive interconnect from diffusing into the dielectric layer.

31. A method for forming first and second conductive regions in an integrated circuit device, comprising:

providing a semiconductor substrate having semiconductor devices and conductive interconnects therein;

forming a first dielectric layer overlying the semiconductor substrate;

forming a first opening in the first dielectric layer, wherein the first opening overlies a conductive interconnect such that the bottom surface of the first opening is formed by the underlying conductive interconnect;

forming a second dielectric layer overlying the first dielectric layer;

forming a second opening in the second dielectric layer, wherein a portion of the second opening overlies a portion of the first opening;

forming a first barrier layer on the bottom surface of the first opening;

removing at least a portion of the first barrier layer such that the first barrier layer material is deposited on the sidewalls of the first opening;

then cleaning the bottom surface of the first opening by adding to a processing chamber an atmosphere comprising a hydrogen-containing species; and forming the first and the second conductive regions in the first and the second openings, respectively, such that the first conductive region is in electrical contact with the underlying conductive interconnect and such that the second conductive region is in electrical contact with the first conductive region.

32. The method of claim 31 wherein the step of forming the first and the second conductive regions further comprises forming a second barrier layer on the bottom surface and the sidewalls of the first and the second openings and forming the first and the second conductive regions in the first and the second openings.

33. The method of claim 32 wherein the material of the first and the second barrier layers is the same material.

34. A method for forming a conductive region in an integrated circuit device, comprising:

providing a semiconductor substrate having semiconductor devices and conductive interconnects therein;

forming in stacked relation overlying the semiconductor substrate, a first barrier layer, a first dielectric layer, a second barrier layer and a second dielectric layer;

forming first and second openings in the first and the second dielectric layers, respectively, wherein the first opening overlies a conductive interconnect, and wherein a portion of the second opening overlies a portion of the first opening;

removing any remaining portions of the first and the second barrier layers from the bottom of the first and the second openings;

forming a third barrier layer on the bottom surface of the first opening;

removing at least a portion of the third barrier layer from the bottom surface to the sidewalls of the first opening;

then cleaning the bottom surface of the first opening by adding to a processing chamber an atmosphere comprising a hydrogen-containing species;

forming a fourth barrier layer on the bottom surface and the sidewalls of the first and the second openings; and forming the conductive region in the first and the second openings, respectively, such that the lower surface of the conductive region is in electrical contact with the underlying conductive interconnect.

35. The method of claim 34 wherein the third and the fourth barrier layers are formed of the same material.

36. A method for preventing contamination of a dielectric caused by diffusion of a contaminating material into the dielectric, wherein the dielectric has an opening therein, and wherein the contaminating material forms the bottom surface of the opening, said method comprising:

(a) forming a barrier layer on the bottom surface of the opening overlying the contaminating material; and (b) removing portions of the barrier layer from the bottom surface to the sidewalls of the opening and then cleaning the bottom surface of the opening by adding to a processing chamber an atmosphere comprising a hydrogen-containing species, wherein during the cleaning process the contaminating material may be deposited on the sidewalls of the opening, wherein the contaminating material is prevented from diffusing into the dielectric material by the barrier layer material.

37. The method of claim 36 wherein the step (b) comprises two independent steps of removing portions of the barrier layer and cleaning the bottom surface.

38. A method for forming a conductive region in an integrated circuit device, comprising:

providing a semiconductor substrate having semiconductor devices and conductive interconnects therein;

forming in stacked relation overlying the semiconductor substrate, a first barrier layer, a first dielectric layer, a second barrier layer and a second dielectric layer;

forming first and second openings in the first and the second dielectric layers, respectively wherein the first opening overlies a conductive interconnect, and wherein a portion of the second opening overlies the first opening;

forming a third barrier layer on the bottom surface of the first opening;

removing at least a portion of the third barrier layer from the bottom surface to the sidewalls of the first opening;

removing the first barrier layer from the bottom of the first openings;

removing the second barrier layer from the bottom of second openings;

then cleaning the bottom surface of the first opening by adding to a processing chamber an atmosphere comprising a hydrogen-containing species;

forming a fourth barrier layer on the bottom surface and the sidewalls of the first and the second openings; and forming the conductive region in the first and the second openings, respectively, such that the lower surface of the conductive region is in electrical contact with the underlying conductive interconnect.

39. The method of claim 38 wherein the third and the fourth barrier layers are formed of the same material.

* * * * *